Figure 3A:
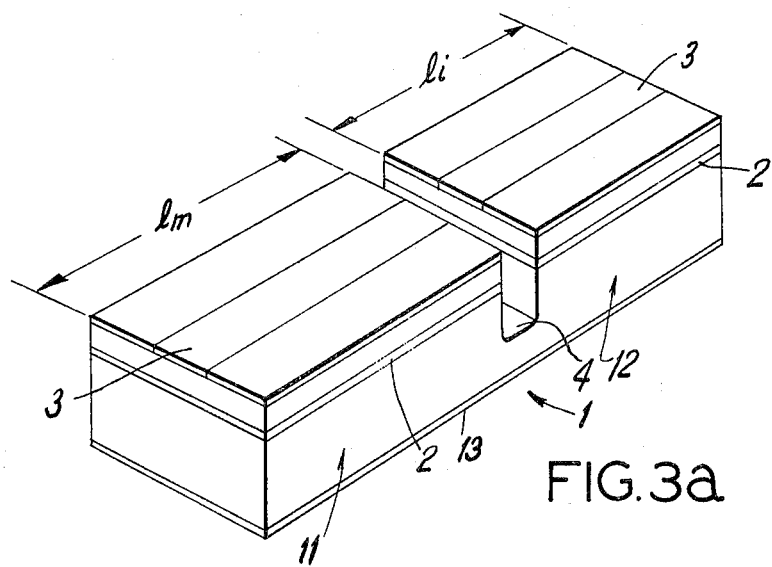

United States Patent [19]
Lang et al.

[11] 3,999,146
[45] Dec. 21, 1976

[54] SEMICONDUCTOR LASER DEVICE

[75] Inventors: Roy Lang; Kohroh Kobayashi, both of Tokyo, Japan

[73] Assignee: Nippon Electric Co., Ltd., Tokyo, Japan

[22] Filed: Aug. 19, 1975

[21] Appl. No.: 605,810

[30] Foreign Application Priority Data

Aug. 23, 1974 Japan .............................. 49-96737
Dec. 27, 1974 Japan ................................ 50-1863
Jan. 16, 1975 Japan .......................... 50-8229[U]
Jan. 17, 1975 Japan ................................ 50-8050
Jan. 17, 1975 Japan .......................... 50-8701[U]

[52] U.S. Cl. .................... 331/94.5 M; 331/94.5 T
[51] Int. Cl.² ......................................... H01S 3/10
[58] Field of Search .................................. 331/94.5

[56] References Cited
OTHER PUBLICATIONS

Nathan et al., GaAs Injection Laser with Novel Mode Control and Switching Properties, J. Appl. Phys., vol. 36, No. 2, (Feb. 1965), pp. 473–480.

*Primary Examiner*—William L. Sikes
*Attorney, Agent, or Firm*—Hopgood, Calimafde, Kalil, Blaustein & Lieberman

[57] ABSTRACT

A semiconductor laser device is disclosed in which an external light beam having a wavelength approximately the same as at least one of the wavelengths of the resonance axial mode for the modulation semiconductor laser to oscillate is injected into the optical resonator of the modulation semiconductor laser.

4 Claims, 6 Drawing Figures

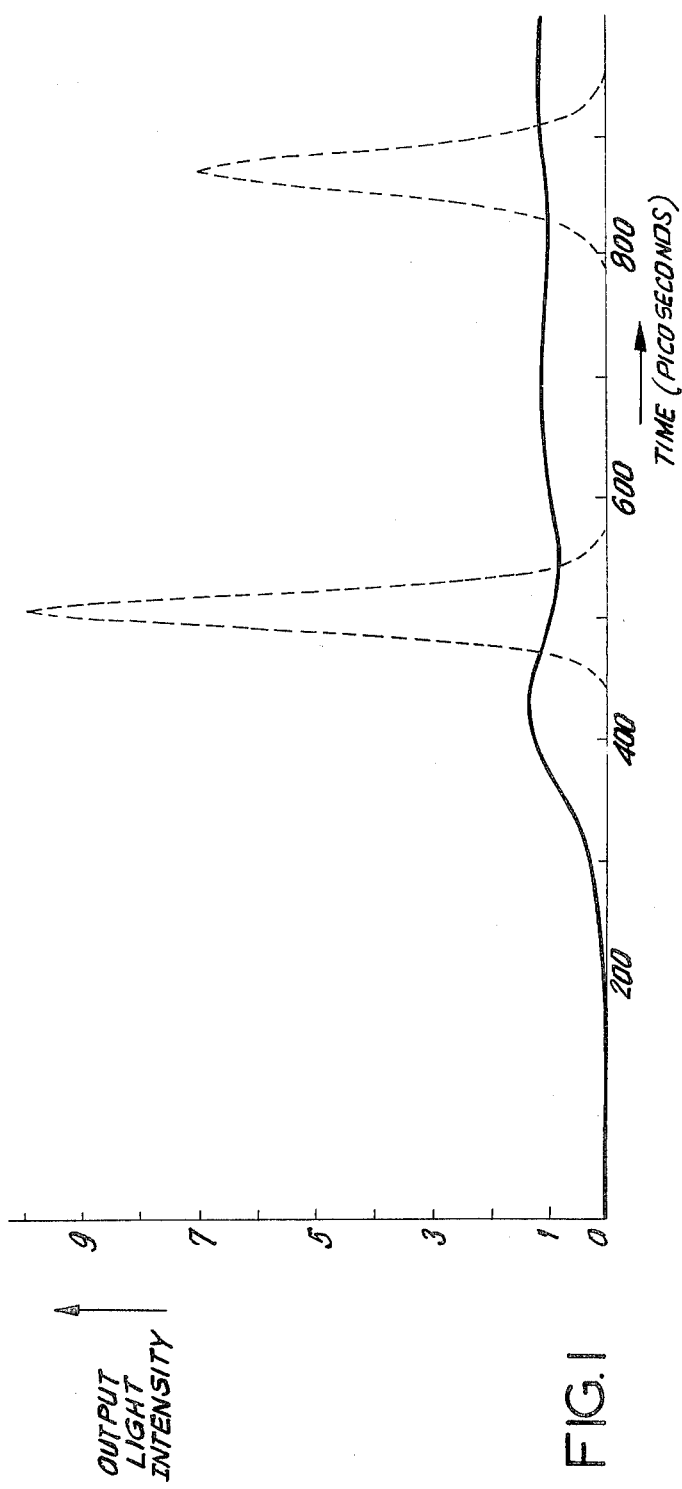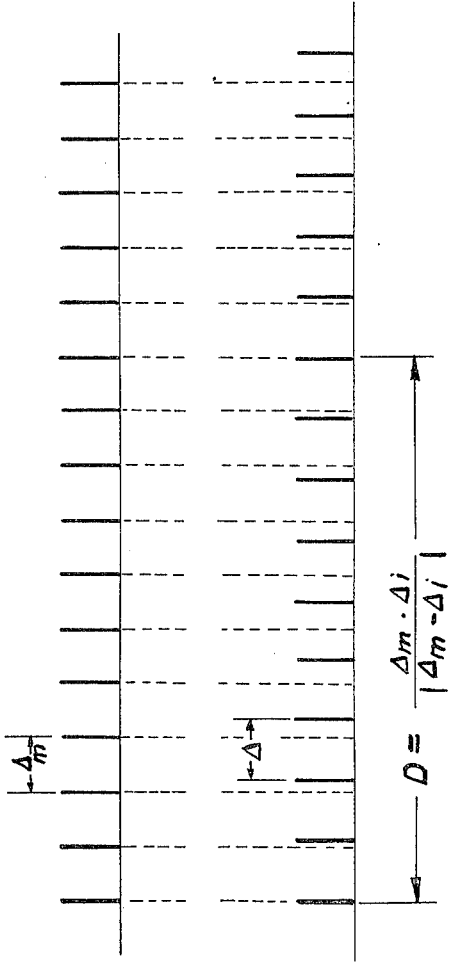

SEMICONDUCTOR LASER DEVICE

The present invention relates generally to semiconductor lasers of the type providing a modulated output, and more particularly to semiconductor lasers capable of providing desirable optical output pulse waveforms and thus making output modulation available at high speed.

Semiconductor lasers are considered to be desirable sources for optical communication systems and optical data processing system because they are small in size, light in weight, operable with high efficiency, and have the ability to be modulated directly by varying the injection current. In a practical semiconductor laser, the upper limit for the rate of direct modulation of the laser output by the signal pulse current is not greater than 400 megabits per second. This is because the optical output waveform is distorted due to spiking oscillations which include an output pulse overshoot emerging immediately after the rise of the pulse, and relaxation oscillations following such overshoot. The spiking oscillation appearing in the optical output accompanies an oscillation of carrier density excited in the semiconductor which operates as a laser medium. The oscillation of carrier density leads to variations in the dielectric constant in the laser, i.e., variations in the resonant wavelength of the laser resonator. As a result, the so-called chirping phenomenon—the center wavelength of the optical output varying with laser oscillation—takes place. This has limited the use of semiconductor lasers in a region where the wavelength must be stable.

To reduce the delay in the optical output waveform and lower the spiked pulse amplitude, prior art techniques have superposed on the signal pulse current a DC bias current larger than the threshold current which initiates laser oscillation in the semiconductor. Prior art techniques, however, have failed to suppress the spiking oscillation in the output pulse to a satisfactory level. Furthermore, in the conventional semiconductor laser, the steady part of the optical output increases, causing the output S/N ratio to be lowered. It is therefore an object of the invention to provide a semiconductor laser device in which the output S/N ratio is increased, the amplitude of the spiking oscillation in the optical output is minimized, the optical output is generated in a waveform faithful to the drive current waveform, and thus the upper limit for the rate of laser modulation is increased.

With this and other objects in view, the invention provides a semiconductor laser device for high speed modulation in which an external light beam having a wavelength approximately the same as at least one of the wavelengths of the resonance axial mode for the modulation semiconductor laser to oscillate is injected into the optical resonator of the modulation semiconductor laser.

Figure 3B:
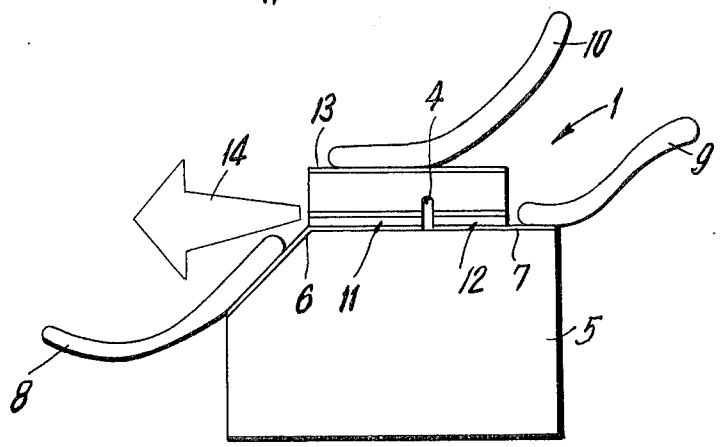
Figure 4:
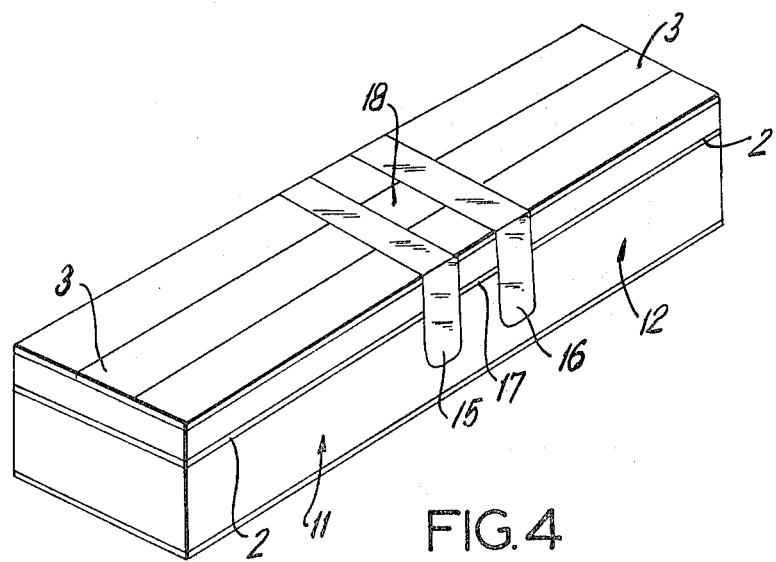

Other objects, features and advantages of the invention will become apparent from the following detailed description taken in conjunction with the accompanying drawings, wherein:

FIG. 1 is a graphic diagram showing transient changes in the intensity of an output beam from a modulation semiconductor laser, FIG. 2 is a diagram showing the principle of wavelength matching between the axial modes of a modulation semiconductor laser and an injection semiconductor laser, FIG. 3(a) is a perspective view of a semiconductor laser according to one embodiment of the invention realized according to the principle illustrated in FIG. 2, and FIG. 3(b) is a side view of the semiconductor laser shown in FIG. 3(a), and FIG. 4 is a perspective view of a semiconductor laser according to another embodiment of the invention.

Changes in the laser output with lapse of time by current modulation can be theoretically analyzed by the use of two simultaneous differential equations, called rate equations, regarding changes in the carrier density excited in the semiconductor laser and changes in the photon density having interaction on the carrier density. When an external coherent light beam with a wavelength approximately the same as the wavelength of the output of a semiconductor laser operated under current modulation is steadily injected into the optical resonator of the semiconductor laser, the transient response characteristic for the current pulse signal of this semiconductor laser can easily be examined by solving the simultaneous differential equations after adding a constant term proportional to the value of the external light that is steadily injected thereinto to that one of those equations which describes the changes in the photon density with lapse of time.

FIG. 1 is a graphic diagram showing transient changes in the modulated light output of a semiconductor laser, which are plotted by solving the differential equations through numerical integration by the use of a computer. The curves shown indicate changes in the output light intensity obtained by superposing on a semiconductor laser a pulse current starting from time $t$ ($=0$) with a height 0.4 times the threshold current and a length longer than 1 nanosecond, the semiconductor laser being under a steady state when a steady biasing current 0.9 times the threshold current is applied. The dotted line is for operation when no external light is injected, and the solid line is for operation when an external light beam of a value corresponding to 1% of a steady light output obtained by applying to the semiconductor laser a steady current 1.3 times the oscillation-initiating threshold current. The curves in FIG. 1 signify the fact that the spiking oscillations appearing at transient changes in the output light intensity under the application of a pulse current is considerably damped or quickly attenuated by the steady injection of an external light beam. They also signify the fact that the delay of the presence of a light output from the beginning of the application of a pulse current is reduced by about 100 picoseconds. The two output light intensities in average with respect to time are nearly equal to each other. In other words, the efficiency in conversion from electric energy into light output is nearly the same in the two instances. The inventors of this invention have found that the foregoing injection of external light affects transient changes in the semiconductor laser output in the following manner. First, the initial amplitude of the spiking oscillation decreases with an increase in the value of the steadily injected external light. Second, the amplitude of the spiking oscillation attenuates exponentially, and the time constant of this attenuation or the half value period of the amplitude decreases with an increase in the value of the injected external light. These effects appear apparently when the value of the injected external light is about 1% of the steady output under laser oscillation. Hence the S/N ratio in the output is not considerably lowered. Thus, by steadily injecting a small amount of external light into the resonator of the semiconductor laser, the relaxation oscillation appearing in the light output during modulation can be essentially suppressed. At the same time, the wavelength can be stabilized by suppressing the chirping phenomenon.

In connection with the above analytical data, the following has been verified experimentally. The spiking oscillation can be suppressed as long as the wavelength of the injected light is equal to at least one of the wavelengths of the resonance axial mode. The resonance axial mode where oscillation can occur exists in the wavelength range of the gain width (about 90% of the peak gain) of the modulation semiconductor laser. The condition that the wavelength of the resonance axial mode meets that of the injected light will hereinafter be called the wavelength matching condition.

An arrangement for readily realizing the wavelength matching condition for applications where a semiconductor laser is used as an external light source will be described by referring to FIG. 2, in which (a) indicates the resonance axial mode of a modulation semiconductor laser, and (b) the resonance axial mode of an injection semiconductor laser.

The two axial modes become approximately coincident with each other the second time after their first coincidence, at a wavelength distant by the value D shown below from the wavelength at which the first coincidence occurred.

$$D = \Delta_m \cdot \Delta_i / |\Delta_m - \Delta_i| \qquad (1)$$

where $\Delta_m$ and $\Delta_i$ are wavelengths for the axial modes of the modulation and injection semiconductor lasers respectively. If it is assumed that $\Delta_m$ and $\Delta_i$ are 4.5 and 5A respectively, there must exist one place in the wavelength range of 45A where the wavelengths of the two semiconductor lasers approximately coincide with each other in their axial modes.

As is apparent from Eq. (1), the value of D will become too large when the axial mode interval between $\Delta_m$ and $\Delta_i$ is very small. If so, it is likely that axial mode coincidence will take place outside the gain width of the modulation semiconductor. In such event, the wavelength matching condition is not satisfied and no substantial result is reached. To avoid this problem, the interval between the resonance axial modes of the two semiconductor lasers is designed so that the value of D is smaller than the gain width of the modulation laser.

To provide a distance between the resonance mode wavelengths of the two semiconductor lasers, it is necessary to provide an adequate difference between the lengths of the resonators of the two semiconductor lasers. These design targets can readily be achieved since the gain width of, for example, a GaAs semiconductor laser fabricated in a usual manner is about 100A. As is well known, the center wavelength of oscillation often differs in semiconductor lasers due to reasons such as crystal inhomogeneity. However, by providing different wavelengths of the resonance axial mode interval in the two lasers, wavelength matching can be attained and spiking oscillation in the output light of the modulation laser can easily be suppressed as long as the center wavelength deviation in the two semiconductor lasers is not greater than half the gain width of the modulation semiconductor laser.

These axial modes have their wavelength ranges where an interaction dependent upon the value of active Q of the resonator is available. Therefore, it is only necessary that the axial modes of the modulation and injection semiconductor lasers agree with each other in the range where the individual interaction is available. More specifically, in an ordinary GaAs semiconductor laser, the allowable limit of the center wavelength deviation is about 0.2A. In other words, if the lengths of the resonators of the two lasers are equal, no wavelength matching will be reached when the difference between the center wavelengths of oscillation in the two lasers exceeds about 0.2A. Even under such condition, however, it is feasible to establish wavelength matching by changing the temperature of one of the lasers. In practice, this temperature must be controlled to an accuracy of 0.2° C, which necessitates sophisticated device construction and increase in the size of the device contrary to the fact that the semiconductor laser is supposed to be small in size, light in weight and operable with ease.

In the embodiment of the invention illustrated in FIG. 3(a), a semiconductor laser device generally designated as 1 having a multilayer structure is shown by model. The laser device comprises a modulation part 11 and an injection part 12 with respective resonators of lengths $l_m$ and $l_i$. This device may be fabricated by forming a double-heterojunction laser crystal of GaAs-AlGaAs by a liquid-phase growth technique, forming a stripe-geometry electrode 3 on the side near the active region 2 of the laser crystal by photoresist techniques, and forming a groove 4 past the active region 2 by photoresist and ion-milling techniques in combination. This semiconductor device has a gain width of about 100A, for which the resonator lengths $l_m$ and $l_i$ are determined to be about 250 μm and 230 μm respectively. Then the wavelengths of the resonance axial mode intervals are 3.44 and 3.74A respectively, so that the wavelength distance D to bring about axial mode wavelength coincidence as computed by equation (1), is 43A. Hence, as described, the condition for wavelength matching is duly satisfied.

As shown in FIG. 3(b), the semiconductor laser device 1 is bonded to a diamond heat sink 5 so that the side of the stripe electrode 3 comes in contact with the diamond. The heat sink 5 is equipped with electrodes 6 and 7 corresponding to the modulation part 11 and the injection part 12 respectively. A positive electrode lead 8 for applying a modulation current and a positive electrode lead 9 for applying an injection current are soldered to the electrode 6 and 7 respectively. A lead 10 which is common for negative electrodes is soldered to a substrate side electrode 13.

In order to provide a light output 14 of which the waveform faithfully responds to a PCM current waveform, a DC current, e.g., 140 mA, to cause the injection semiconductor laser to bring about a steady oscillation is constantly applied to the positive electrode lead 9, and thereby a constant output light beam is injected into the resonator of the modulation part 11. At the same time, a PCM current on which a steady bias, e.g., 100 mA, insufficient to cause oscillation at the modulation part in response to a 0 state and sufficient to cause oscillation in response to a 1 state of the PCM current, is superposed is applied to the positive electrode lead 8.

The quantity of light injected into the resonator of the modulation part 11 depends partly upon the width of the groove 4; however, this light quantity can be determined to optimize the characteristic of the light signal output of the modulation part 11 by controlling the value of the steady current applied to the injection part 12. When it is so arranged that a filtering medium is interposed in the groove 4, the quantity of the injected light can be determined to be optimum by suitably choosing the refraction index or absorption coefficient of the medium.

The embodiment of the invention illustrated in FIG. 4 is particularly suited for operations in which the quantity of injection light is varied. In this embodiment, two grooves 15 and 16 are formed between the modulation part 11 and the injection part 12, the distance between the two grooves being set to be about 20 μm. In the semiconductor laser formed by the active region 17 located beneath the electrode 18, the threshold current for oscillation is considerably higher than in the lasers of modulation part 11 and injection part 12. Hence, by controlling the steady current applied to the electrode 18, it becomes possible to control the degree of excitation of the active region 17 located beneath the electrode 18, i.e., the quantity of light absorbed by the active region 17. As in the embodiment shown in FIG. 3, a filtering medium may be interposed in each of the grooves 15 and 16, the medium having a refraction index smaller than that of the active region. By suitably determining the refraction index and light absorption coefficient of the filtering media, an optimum quantity of light injected into another laser can be obtained.

As described above, the laser device of the invention employs a means for slightly changing the interval between the resonance axial mode wavelengths of the injection and modulation semiconductor lasers, thereby facilitating wavelength matching between the two lasers. Furthermore, this laser device operates stably against temperature changes. More specifically, even if there is a deviation between the center wavelengths of oscillation in the two semiconductor lasers because of temperature changes in the active regions of the two lasers or difference in the dependence of a laser oscillation wavelength upon temperature, there is at least one place where the axial modes of the two lasers nearly coincide with each other as long as the center wavelength deviation is not greater than half the gain width of the modulation semiconductor laser. Thus spiking oscillations can be suppressed.

According to the invention, therefore, the influence from crystal inhomogeneity does not become a significant problem and wavelength matching can easily be attained even if the injection and modulation semiconductor lasers are fabricated separately. In a laser device having the two semiconductor lasers fabricated separately, the quantity of light injected can be controlled by differentiating the optical axes of by the two lasers or changing the incident angles. The current applied to the injection laser is not confined to DC current but may be pulsed as long as the light output of the injection laser is in the steady state when the light output waveform of the modulation laser rises.

It is apparent that the laser device of the invention is not limited to the structures of the foregoing embodiments but is also applicable to other structures in which spiking oscillations are suppressed by using a semiconductor laser as the injection light source. For example, the invention is readily applicable to a semiconductor laser device of the distributed-feedback structure, such as that described in detail by D. R. Schitres, R. D. Burnham and W. Striefer in their article "Distributed-Feedback Single Heterojunction GaAs Laser," published on Aug. 15, 1974.

In the structure in which the resonators of the two lasers are located close and in parallel to each other in the same crystal, part of the internal light in the active region of the injection laser can be injected into the active region of the modulation laser by diffraction and scattering of such light in the active region of the injection laser. When the distance between the two active regions is less than 10 μm, the influence from crystal inhomogeneity is negligible and oscillation becomes feasible at nearly the same center wavelength. In other words, even if the two resonators were of the same length, wavelength matching can be attained relatively easily.

The invention has been described in connection with semiconductor laser devices in which a semiconductor laser is used for the purpose of injection from an external light source. It is apparent that the invention is not limited to this semiconductor laser light source but is also applicable to any light source which satisfies the wavelength matching condition. It will thus be apparent that other modifications may be made to the embodiments of the invention herein specifically described, without necessarily departing from the spirit and scope of the invention.

What is claimed is:

1. A pulse-modulatable semiconductor laser device comprising: a modulatable semiconductor laser element with a laser cavity exhibiting a steady state and an oscillating state in response to an applied pulse-modulated current signal, and an external light source disposed outside of said cavity and emitting a light beam including substantially the same wave length as that of an output light beam generated in said oscillating state; wherein said external light source is so oriented as to inject a light beam of a predetermined intensity into the active region of said laser element when said laser element is placed in said oscillating state in response to said current signal, thereby to suppress spiking oscillator of the output light of said laser element in the intensity waveform on the time axis.

2. The pulse-modulatable semiconductor laser device as claimed in claim 1, wherein said external light source comprises an injection semiconductor laser element having approximately the same crystal structure as said modulatable laser element.

3. The pulse-modulatable semi-conductor laser device as claimed in claim 2 wherein the relationship between the axial mode intervals $\Delta_m$ and $\Delta_i$ of the output light beams of said modulatable laser element and said injection laser element satisfies the condition that the gain width of said modulatable laser element is equal to or less than the value $$\Delta_m \cdot \Delta_i / |\Delta_m - \Delta_i|.$$

4. The semiconductor device of claim 1, comprising a substrate including a modulation part and an injection part to which said current signal is applied, each of said injection and modulation parts including an active region separated by a groove formed in said substrate and extending into said substrate below the plane of said active regions.

* * * * *